(12) United States Patent
Chen et al.

(10) Patent No.: US 9,665,426 B2
(45) Date of Patent: May 30, 2017

(54) SEMICONDUCTOR DEVICE AND READING METHOD

(71) Applicant: KABUSHIKI KAISHA TOSHIBA, Tokyo (JP)

(72) Inventors: Jiezhi Chen, Kanagawa (JP); Kuniharu Takahashi, Kanagawa (JP); Hiroyuki Nagashima, Kanagawa (JP); Yuichiro Mitani, Kanagawa (JP); Katsuki Matsudera, Kanagawa (JP); Kazunori Kanebako, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 14/945,932

(22) Filed: Nov. 19, 2015

(65) Prior Publication Data

US 2016/0217035 A1   Jul. 28, 2016

(30) Foreign Application Priority Data

Jan. 28, 2015   (JP) .................................. 2015-014740

(51) Int. Cl.
*G11C 29/00*   (2006.01)
*G06F 11/10*   (2006.01)
(Continued)

(52) U.S. Cl.
CPC ...... *G06F 11/1072* (2013.01); *G11C 11/5642* (2013.01); *G11C 16/26* (2013.01);
(Continued)

(58) Field of Classification Search
CPC ............. G06F 11/1072; G11C 11/5642; G11C 16/0483; G11C 16/26; G11C 16/3418
See application file for complete search history.

(56) References Cited

U.S. PATENT DOCUMENTS

| 8,164,961 B2 | 4/2012 | Honma |
| 8,406,053 B1 | 3/2013 | Dutta et al. |

(Continued)

FOREIGN PATENT DOCUMENTS

| JP | 2002-93069 | 3/2002 |
| JP | 2007-200552 | 8/2007 |

(Continued)

*Primary Examiner* — David Ton
(74) *Attorney, Agent, or Firm* — Finnegan, Henderson, Farabow, Garrett & Dunner, L.L.P.

(57) ABSTRACT

According to an embodiment, a semiconductor device includes an error corrector, a read controller, and a majority processor. The error corrector is configured to perform error correction on data read from a storage, and output the number of errors contained in the data when errors cannot be corrected by the error correction. The read controller is configured to read pieces of data from a first address in the storage according to respective read conditions, select, from the read conditions, a read condition corresponding to a smallest of the numbers of errors obtained by the error correction performed on the pieces of data corresponding to the respective read conditions, and perform reading from the first address multiple times according to the selected read condition. The majority processor is configured to perform a majority process between a plurality of pieces of data obtained by the multiple times of reading.

5 Claims, 15 Drawing Sheets

(51) Int. Cl.
  *G11C 11/56*      (2006.01)
  *G11C 29/52*      (2006.01)
  *G11C 16/26*      (2006.01)
  *G11C 16/34*      (2006.01)
  *G11C 16/04*      (2006.01)
  *G11C 29/02*      (2006.01)
  *G11C 29/04*      (2006.01)

(52) U.S. Cl.
  CPC .......... *G11C 16/3418* (2013.01); *G11C 29/52* (2013.01); *G11C 16/0483* (2013.01); *G11C 29/021* (2013.01); *G11C 29/028* (2013.01); *G11C 2029/0411* (2013.01)

(56)              References Cited

U.S. PATENT DOCUMENTS

| 8,837,215 B2 | 9/2014 | Lee |
| 2012/0268994 A1 | 10/2012 | Nagashima |
| 2014/0036597 A1* | 2/2014 | Nakayama ............. G11C 16/26 |
| | | 365/185.21 |
| 2016/0027485 A1* | 1/2016 | Park .................... G11C 29/021 |
| | | 365/191 |

FOREIGN PATENT DOCUMENTS

| JP | 2009-43410 | 2/2009 |
| JP | 2010-165400 | 7/2010 |
| JP | 2011-100519 | 5/2011 |

* cited by examiner

SEMICONDUCTOR DEVICE AND READING METHOD

CROSS-REFERENCE TO RELATED APPLICATION

This application is based upon and claims the benefit of priority from Japanese Patent Application No. 2015-014740, filed on Jan. 28, 2015; the entire contents of which are incorporated herein by reference.

FIELD

Embodiments described herein relate generally to a semiconductor device and a reading method.

BACKGROUND

A nonvolatile semiconductor memory such as a NAND flash memory chip includes a large number of memory cells therein, and is configured to record data in the memory cells by replacing information with the amounts of charge. The voltages of the memory cells change according to the amounts of charge accumulated in floating gates, and the memory cells store data according to the differences in voltage. Reading of data from the memory cells is performed by detecting voltages depending on the charges and performing determination based on thresholds. Data read from the memory cells are subjected to decoding of error correcting codes that have been added thereto when the data were written, then subjected to error correction, and output, for example.

When write and read cycles are repeated in a nonvolatile semiconductor memory, memory cells are gradually deteriorated and read errors occur frequently. Furthermore, the frequency of read errors also changes owing to the environment (such as device temperature) in reading. Since such errors due to deterioration of memory cells and the reading environment have specific tendency, the errors can be relieved through retry read using shift read that is reading with shifted thresholds.

The optimum values of the shift read for the retry read, however, are normally unknown, and the retry read needs to be repeated while switching conditions for the shift read according to a shift table prepared in advance. Furthermore, in particular, in a case of a multi-valued memory in which data of a multi-valued bit are stored in one memory cell, reading needs to be performed multiple number of times to reduce noise in reading. Furthermore, as a result of performing reading multiple number of times through retry read on the memory cells in this manner, read disturb may occur.

DETAILED DESCRIPTION

According to an embodiment, a semiconductor device includes an error corrector, a read controller, and a majority processor. The error corrector is configured to perform error correction on data read from a storage, and output the number of errors contained in the data when errors cannot be corrected by the error correction. The read controller is configured to read pieces of data from a first address in the storage according to respective read conditions, select, from the read conditions, a read condition corresponding to a smallest of the numbers of errors obtained by the error correction performed on the pieces of data corresponding to the respective read conditions, and perform reading from the first address multiple times according to the selected read condition. The majority processor is configured to perform a majority process between a plurality of pieces of data obtained by the multiple times of reading.

Figure 1:
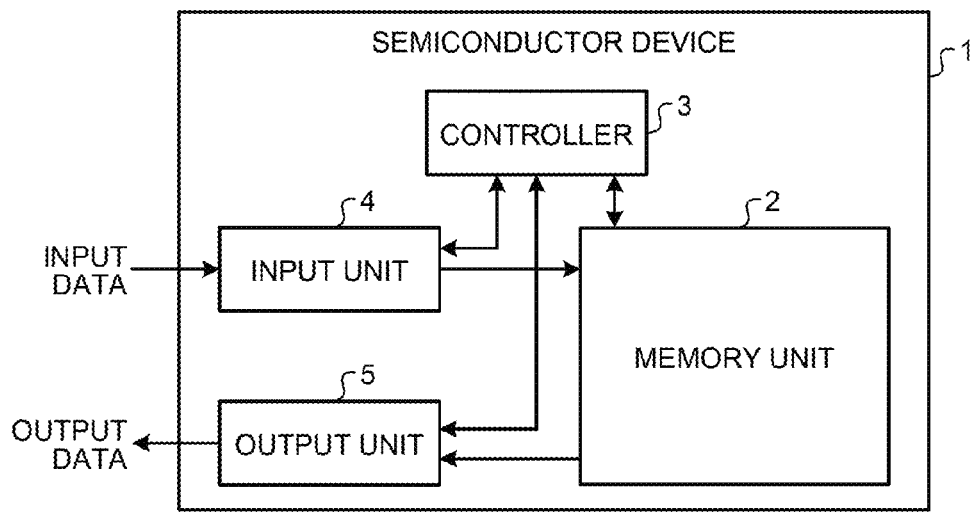
FIG. 1 is a block diagram illustrating an example configuration of a semiconductor device according to an embodiment.

A semiconductor device and a reading method according to an embodiment will be described below. FIG. 1 illustrates an example configuration of a semiconductor device according to an embodiment. In FIG. 1, a semiconductor device 1 includes a memory unit 2, a controller 3, an input unit 4, and an output unit 5, and is capable of storing input data input to the input unit 4 from outside into the memory unit 2 under the control of the controller 3. Data stored in the memory unit 2 are read from the memory unit 2 under the control of the controller 3, and output as output data to the outside by the output unit 5. Thus, the controller 3 has a function as a read controller for controlling reading of data from the memory unit 2.

The controller 3 controls the overall operation of the semiconductor device 1. The memory unit 2 includes a nonvolatile memory. More specifically, the memory unit 2 is a NAND flash memory having two-dimensionally structured cells and includes one or more NAND flash memory chips, for example.

Note that the nonvolatile memory included in the memory unit 2 is not limited to a NAND flash memory having two-dimensionally structured cells. Examples of the nonvolatile memory included in the memory unit 2 may include a three-dimensional bit cost scalable (BiCS) flash memory, a cross-point resistance random access memory (ReRAM), and a magneto resistive random access memory (MRAM).

The input unit 4 receives input data from the outside. The input unit 4 includes an error correction encoder, and is configured to apply an error correction encoding process to the input data (referred to as original data) supplied for storage into the memory unit 2 and outputs error-corrected data. In the embodiment, an encoding method of generating an error correcting code in units of blocks for the original data and adding the generated error correcting code to the original data can be applied as the error correction encoding process.

Examples of the error correcting code that can be applied to the semiconductor device 1 according to the embodiment include a BCH (Bose-Chaudhuri-Hocquenghem) code and a RS (Reed-Solomon) code. The error correcting code applicable to the semiconductor device 1 according to the embodiment is not limited to these examples. For example, other types of error correcting codes according to error correction methods capable of saving original data and acquiring the number of error bits in the original data in decoding may be applied to the semiconductor device 1 according to the embodiment.

The memory unit 2 stores therein data to which the error correcting code is added. The output unit 5 outputs data read from the memory unit 2 as output data to the outside. The output unit 5 includes an error corrector, and is configured to decode the error correcting code added to the data read from the memory unit 2 and perform an error correction process on the data. In this process, when errors in excess of the error correcting capability of the error correcting code are contained in the data, the error corrector ceases the error correction process on the data and outputs the number of errors contained in the data.

Figure 2:
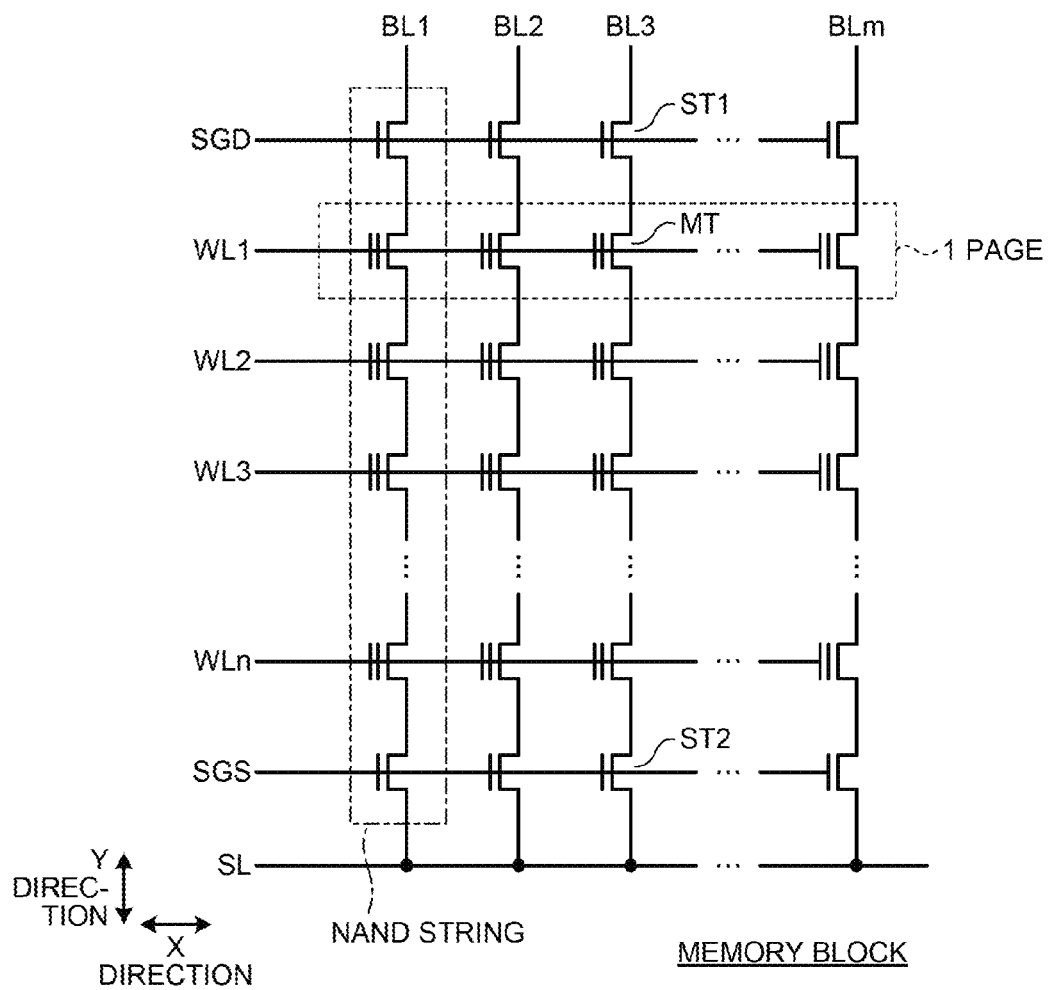
FIG. 2 is an equivalent circuit diagram illustrating an example of the configuration of any one memory block BLK applicable to the embodiment.

Next, a configuration of the NAND flash memory chip will be schematically described. The NAND flash memory chip is constituted by multiple memory blocks BLK that are units of data erasure. A configuration of a memory block ELK will be described with reference to FIG. 2. FIG. 2 is an equivalent circuit diagram illustrating an example of the configuration of any one memory block ELK applicable to the embodiment.

The memory block BLK includes m (m is an integer not smaller than 1) NAND strings arranged along an X direction. Each NAND string includes selection transistors ST1 and ST2, and n (n is an integer not smaller than 1) memory cell transistors MT. The selection transistors ST1 included in the respective m NAND strings have drains connected to bit lines BL1 to BLm and gates connected in common to a selection gate line SGD. The selection transistors ST2 have sources connected in common to a source line SL and gates connected in common to a selection gate line SGS.

Each of the memory cell transistors MT is metal oxide semiconductor field effect transistor (MOSFET) having a stacked gate structure formed on a semiconductor substrate with a gate insulating film therebetween. The stacked gate structure includes a charge accumulation layer (floating gate electrode) formed on the gate insulating film and a control gate electrode formed on the charge accumulation layer with a gate insulating film therebetween. In each NAND string, n memory cell transistors MT are arranged between the source of the selection transistor ST1 and the drain of the selection transistor ST2 in such a manner that the respective current paths are connected in series. In other words, the n memory cell transistors MT are connected in series along a Y direction in such a manner that adjacent memory cell transistors MT share a source region or a drain region.

The memory cell transistors MT have control gate electrodes connected to word lines WL1 to WLn in this order from the one on the most drain side. Thus, the drain of the memory cell transistor MT connected to the word line WL1 is connected to the source of the selection transistor ST1, and the source of the memory cell transistor MT connected to the word line WLn is connected to the drain of the selection transistors ST2.

The word lines WL1 to WLn connect the control gate electrodes of the memory cell transistors MT in common among the NAND strings in the memory block BLK. In other words, the control gate electrodes of the memory cell transistors MT on the same row in the memory block BLK are connected to the same word line WL. Memory cells connected to the same word line WL are treated as one page, and data are recorded and read in units of the pages. Thus, a page is a unit block that is a unit of recording and reading in a NAND flash memory chip. Multiple pages can be managed collectively.

The bit lines BL1 to BLm connect the drains of the selection transistors ST1 in common among the memory blocks BLK. In other words, NAND strings on the same column in multiple memory blocks BLK are connected to the same bit line BL.

The voltage of a memory cell transistor MT changes according to the amount of charge accumulated in the floating gate electrode, and the memory cell transistor MT stores information according to the difference in voltage. The memory cell transistors MT may be configured to store 1-bit information or may be configured to store multi-bit information. The NAND flash memory chip according to the embodiment is configured to store 2-bit or 3-bit information.

In the NAND flash memory chip, the output of a potential generation circuit is connected to the word lines WL1 to WLn and a sense amplifier is connected to each of the bit lines BL1 to BLn. In the NAND flash memory chip, one word line is selected from the word lines WL1 to WLn under the control of a control circuit (controller 3) and the voltage of the word line selected by the potential generation circuit is set to the off-voltage of the memory cell transistors MT while the voltages of the other word lines are set to the on-voltage thereof, for example. The voltages of the bit lines BL1 to BLn are then detected by the sense amplifiers, whereby 1-page data can be read.

Figure 3A:
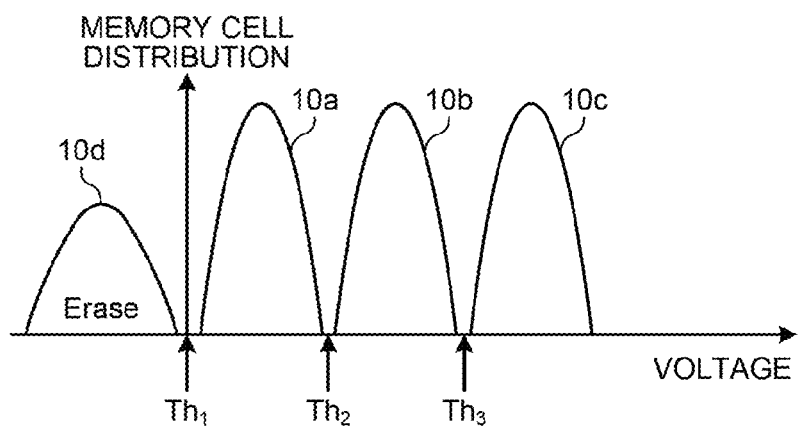
FIGS. 3A and 3B are graphs for explaining multivalued storage in a NAND flash memory chip applicable to the embodiment.
Figure 3B:
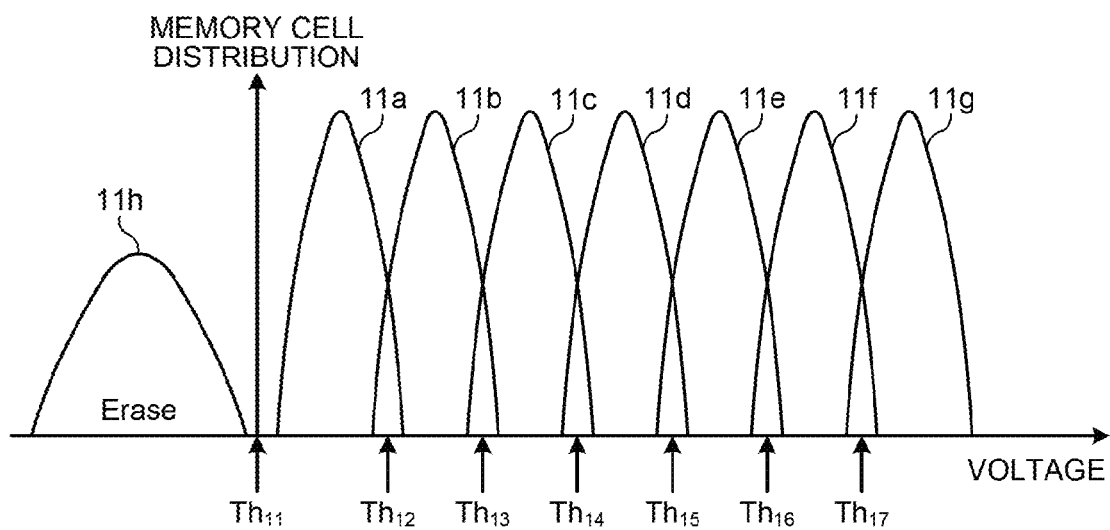

Multivalued storage in a NAND flash memory chip applicable to the embodiment will be described with reference to FIGS. 3A and 3B. FIG. 3A illustrates an example in which 2-bit information is stored in the memory cell transistors MT (hereinafter abbreviated to memory cells), and FIG. 3B illustrates an example in which 3-bit information is stored in the memory cells. In FIGS. 3A and 3B, the vertical axis represents distribution of memory cells and the horizontal axis represents voltages detected by the sense amplifiers.

In the case of FIG. 3A, for example, voltages detected by the sense amplifiers are classified into four levels according to the amounts of charge accumulated in the memory cells, so that 2-bit information is stored. Note that distributions 10a to 10d corresponding to the respective four levels represent distributions of memory cells at voltages detected by the sense amplifiers in the respective levels. Note that the distribution 10d represents a distribution in an erase state (Erase). In the case of FIG. 3A, the four levels can be detected by setting a set of thresholds Th including three thresholds $Th_1$, $Th_2$, and $Th_3$ as a read condition according to the respective distributions 10a to 10d and classifying the voltages detected by the sense amplifiers according to the thresholds $Th_1$, $Th_2$, and $Th_3$, and 2-bit information can thus be stored.

Similarly, in the case of FIG. 3B, voltages detected by the sense amplifiers are classified into eight levels according to the amounts of charge accumulated in the memory cells, so that 3-bit information is stored. In this case, the eight levels are detected by setting a set of thresholds Th including seven thresholds $Th_{11}$ to $Th_{17}$ as a read condition according to respective distributions 11a to 11h corresponding to the respective eight levels and classifying the voltages detected by the sense amplifiers according to the thresholds $Th_{11}$ to $Th_{17}$. Note that the distribution 11h represents a distribution in an erase state (Erase). In the example of FIG. 3B, the distributions 11a to 11g out of the distributions 11a to 11h have one ends or both ends overlapping with adjacent distributions, and the thresholds $Th_{12}$ to $Th_{17}$ are set at the overlapping portions. Information read from memory cells at the ends of the distributions contains a certain percentage of error bits.

In the example of FIG. 3A described above, margins for adjacent distributions are present at both ends of the distributions 10a to 10d and the distributions 10a to 10d do not overlap with each other. The probability of occurrence of error bits is thus low in a normal state. Here, assume a case in which the data retention characteristics of memory cells are deteriorated with write/read cycles, for example. In this case, the margins between the distributions 10a to 10d become gradually smaller and the probability of occurrence of error bits in reading from memory cells at the ends of the distributions becomes higher.

Figure 4A:
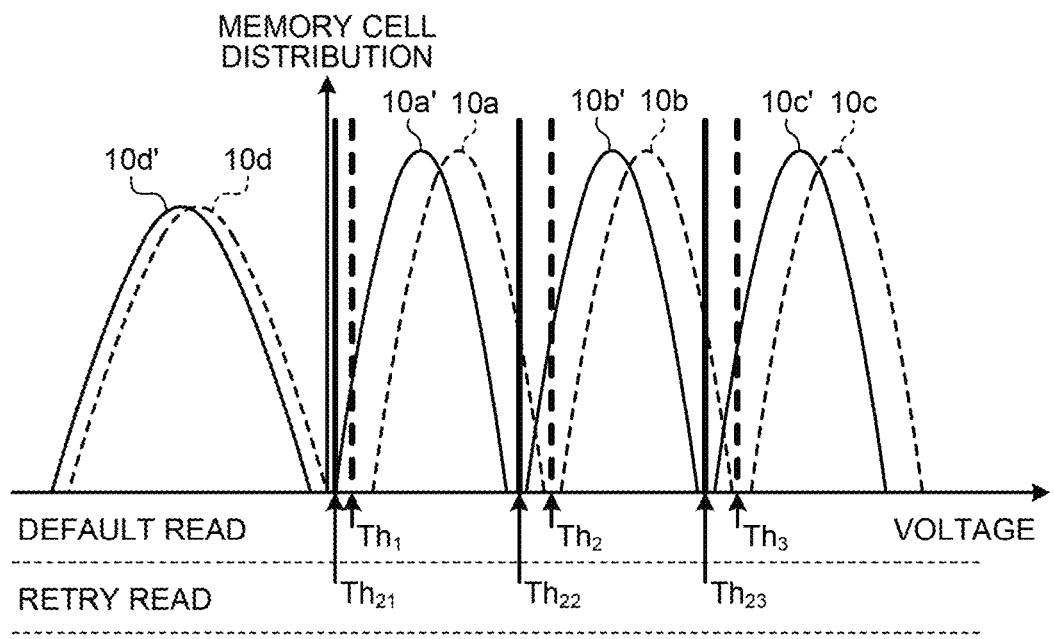
FIGS. 4A and 4B are graphs for explaining retry read applicable to the embodiment.
Figure 4B:
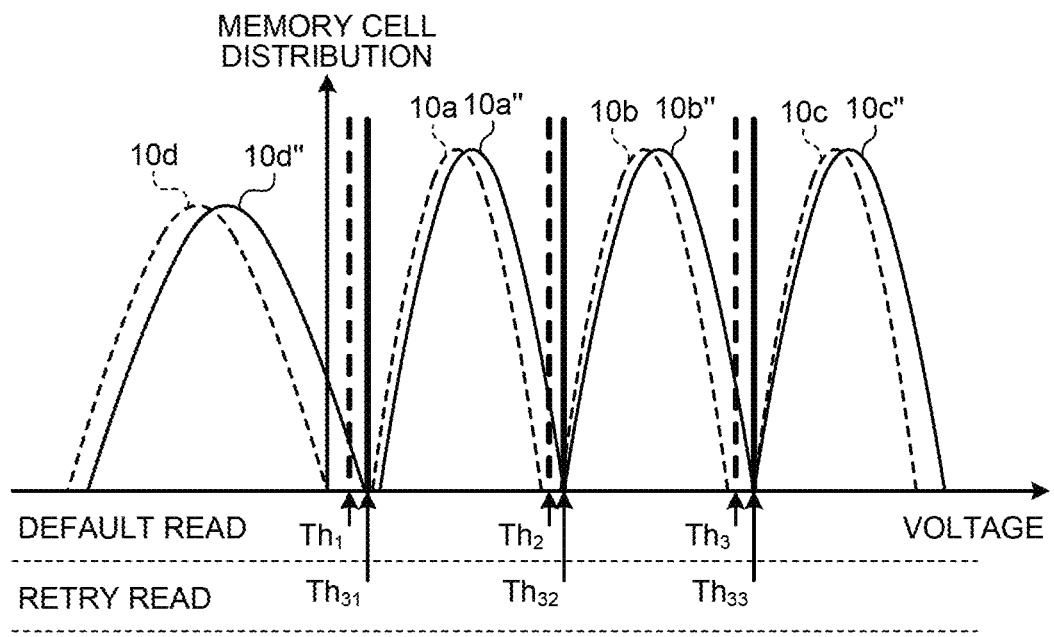

One known method for reducing such occurrence of error bits is retry read, which is re-reading information from memory cells under different conditions. Retry read applicable to the embodiment will be described with reference to FIGS. 4A and 4B. FIGS. 4A and 4B illustrate examples of retry read in the case of 2-bit storage as described with reference to FIG. 3A.

FIG. 4A illustrates an example of retry read for reducing error bits associated with deterioration in the data retention characteristics of memory cells caused by data retention. In an initial state, it is assumed that thresholds $Th_1$, $Th_2$, and $Th_3$ are set as a read condition (default read condition) for the distributions 10a to 10d of memory cells. When deterioration of elements associated with repeated write/read cycles, stored charge retention in a high temperature environment, or the like occurs in the initial state, what is called a down-shift in which the distributions of the memory cells generally shift toward lower voltages as distributions 10a' to 10d'. Thus, even when error correction is performed on bits read from the memory cells under the default read condition, errors in excess of the error correcting capability of error correcting codes are likely be contained in the bits and are less likely to be relieved.

In this case, the thresholds $Th_1$, $Th_2$, and $Th_3$ are also shifted toward lower voltages and the read condition (retry read condition) is set to thresholds $Th_{21}$, $Th_{22}$, and $Th_{23}$. With respect to error bits caused by the down-shift, reading from the memory cells under the retry read condition that compensates for the down-shift can reduce the number of errors contained in the read bits and increases the likelihood of relieving errors through error correction as compared to reading under the default read condition.

FIG. 4B illustrates an example of retry read for reducing error bits associated with program disturb of memory cells. When characteristic deterioration occurs owing to program disturb as a result of repeated write/read cycles, for example, the distributions of the memory cells generally shift toward higher voltages as distributions 10a'' to 10d''. In this case, errors are less likely to be relieved similarly to the above.

In this case, the thresholds $Th_1$, $Th_2$, and $Th_3$ are also shifted toward higher voltages and the read condition is set to thresholds $Th_{31}$, $Th_{32}$, and $Th_{33}$. With respect to error bits caused by the program disturb, use of the thresholds $Th_{31}$, $Th_{32}$, and $Th_{33}$ obtained by shifting the thresholds of the default read condition toward higher voltages in this manner can reduce the number of errors contained in the read bits and increases the likelihood of relieving errors through error correction in reading under the default read condition.

As described above, occurrence of error bits caused by the shift of memory cell distributions can be coped with by changing the read condition on the memory cells to a condition obtained by generally shifting the thresholds. In this case, it is very difficult to know the amounts of shift of the distribution before reading. In practice, it is thus necessary to provide multiple read conditions with different thresholds in advance and try reading from memory cells under each read condition. Furthermore, various causes of error bit occurrence are present such as intercell interference and read disturb in addition to data retention and program disturb mentioned above.

It is thus necessary to provide many read conditions in order to reduce occurrence of error bits. For example, ten or more read conditions need to be provided when the memory cells store 2-bit information, twenty or more read conditions need to be provided when the memory cells store 3-bit information, and a storage area for storing these read conditions needs to be provided. Furthermore, when errors in excess of the error correcting capability of error correcting codes are present in the bits read from the memory cells and errors cannot be corrected, it is necessary to perform retry read under each of all the provided read conditions, which may affect the speed of reading from the memory cells.

Figure 5:
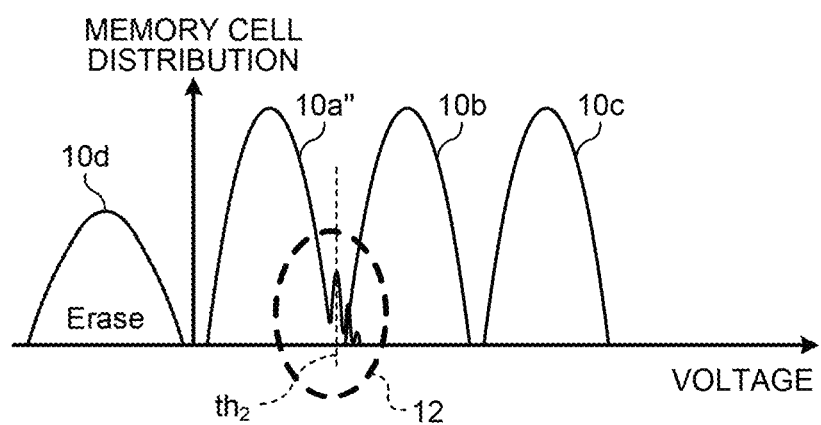
FIG. 5 is a graph illustrating ends of memory cell distributions contain noise.

In addition, as illustrated in FIG. 5, the ends of the distributions may contain noise. Specifically, in FIG. 5, an end (presented as a range 12) of the distribution 10a'' contains noise, which appears to be vibration. In this case, determination at the threshold $th_2$ where the noise is present cannot be performed correctly.

Figure 6:
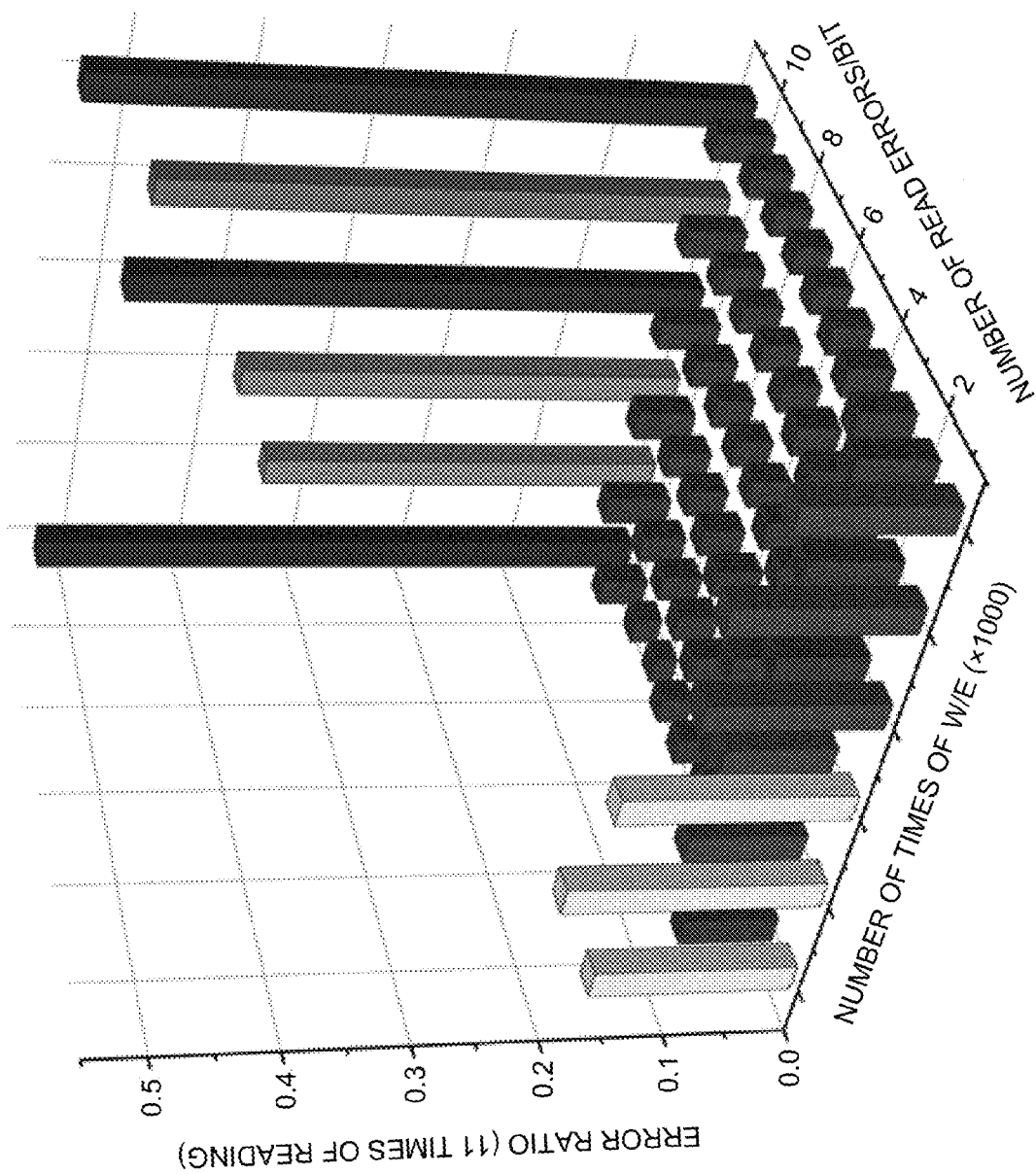
FIG. 6 is a graph for explaining the dependency of the bit error ratio on the number of write/read cycles.

Next, the dependency of the bit error ratio on the number of write/read cycles will be described with reference to FIGS. 6 and 7. FIG. 6 illustrates the dependency of the bit error ratio on the number of times of write/read on the basis of measured values. Note that write/erase cycles are used instead of write/read cycles in FIG. 6. FIG. 6 presents measured values obtained by performing reading (read) from the memory cells 11 times at the 1000-th, 3000-th, 5000-th, . . . times of W/E operation on the memory cells under the same read condition and measuring the number of error bits contained in each of the read bits.

In FIG. 6, the x-axis represents the number of times of W/E operation in units of 1000 times. The y-axis represents the number N (N=1 to 11) of read errors in 11 times of read operation for each of the bits read from the memory cells. The z-axis represents, as an error rate, a ratio M(N)/Z of the number M(N) of error bits having occurred at each number N of errors to the total number Z of error bits having occurred in 11 times of read operation.

In FIG. 6, the number of read errors N=1 to 3 is considered to include the number of accidental errors, that is, errors caused by the characteristic variation of the memory cells, the characteristic variation of circuits (sense amplifiers, for example) associated with the memory cells, and the like. The numbers N4 to 10 of read errors are also present independent of the number of times of W/E operation. Note that the error ratio at the number of read errors N=11 is considered to correspond to defective memory cells.

Figure 7:
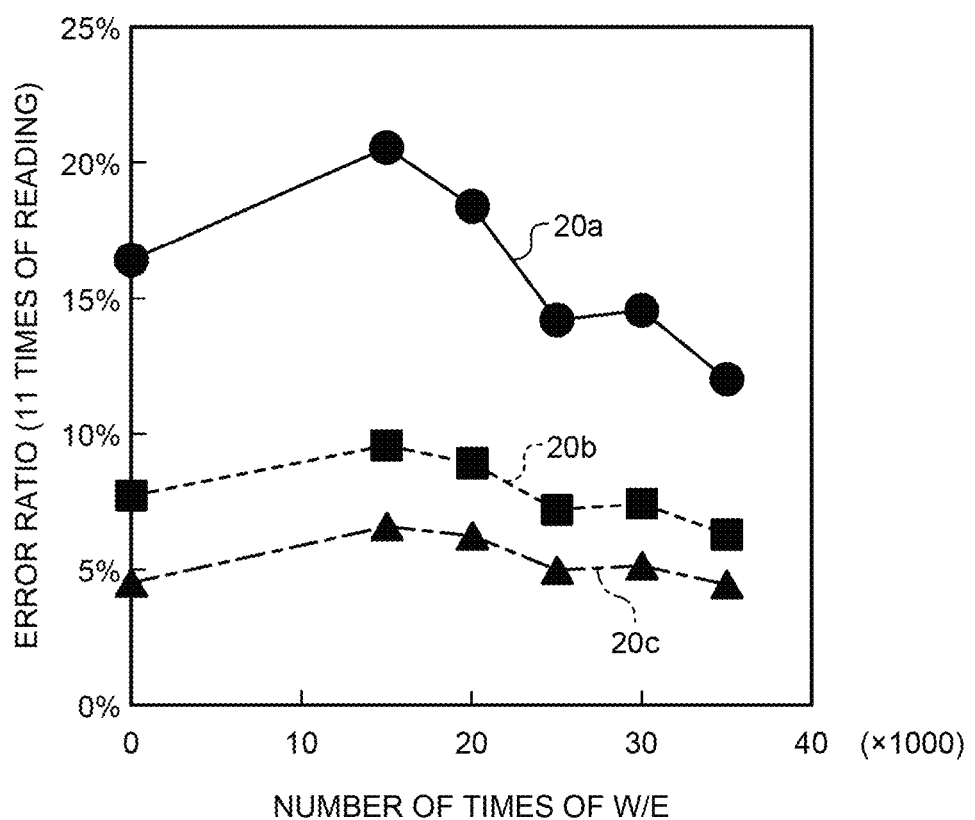
FIG. 7 is a graph for explaining the dependency of the bit error ratio on the number of write/read cycles.

FIG. 7 is a graph corresponding to extraction of the cases where the numbers of read errors are N=1 to 3 from FIG. 6. In FIG. 7, the vertical axis and the horizontal axis correspond to the error ratio and the number of times of W/E, respectively, in FIG. 6. Furthermore, in FIG. 7, a characteristic line 20a represents an example in which the number of read errors is N=1, a characteristic line 20b represents an example in which the number of read errors is N=2, and a characteristic line 20c represents an example in which the number of read errors is N=3.

FIG. 7 indicates that elimination of errors of bits with the number of read errors N=1 can reduce the number of bits that are likely to be errors by about 10 to 20%. FIG. 7 also indicates that elimination of errors of bits with the number of read errors N=2 can reduce the number of bits that are likely to be errors by about 8%. FIG. 7 further indicates that elimination of errors of bits with the number of read errors N=3 can reduce the number of bits that are likely to be errors by about 5%. These indicate that elimination of all the errors of bits with the numbers of read errors N=1 to 3 can reduce the number of bits that are likely to be errors by about 30%.

Read Process According to Embodiment

Next, a read process according to an embodiment will be described. In the embodiment, a majority process is introduced for reading data from memory cells. A majority process includes comparing data obtained by reading from the same address a plurality of times (s>2; s is an integer) and using, as read data, data read more than (s−1)/2 times when s is an odd number or data read more than s/2 times when s is an even number.

Figure 8:
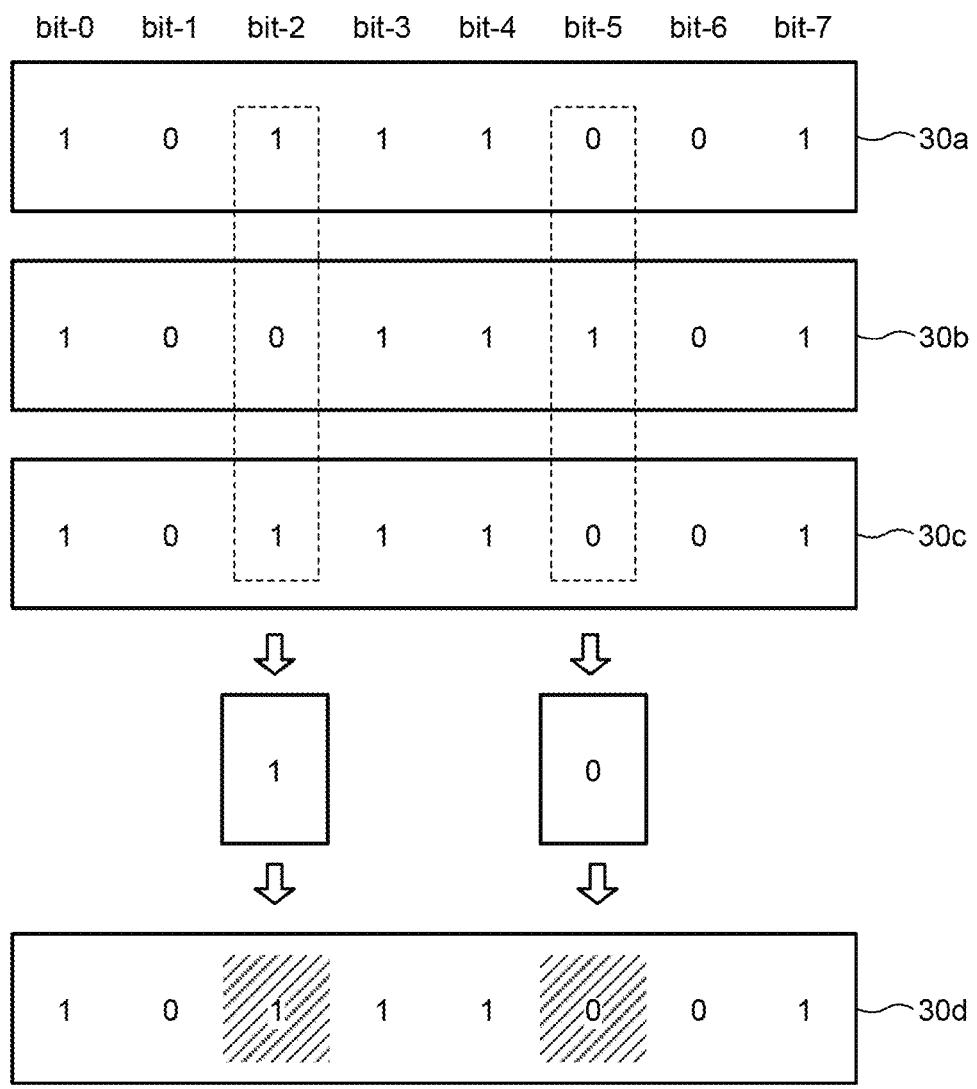
FIG. 8 is a diagram for explaining a majority process applicable to the embodiment.

A majority process applicable to the embodiment will be described more specifically with reference to FIG. 8. Herein, for the sake of explanation, a case in which 8-bit data constituted by a bit string of bits bit-0 to bit-7 are read out three times (s=3) from the same address under the same read condition will be described. As illustrated in FIG. 8, assume that bits of the bit string of first read data 30a are "10111001", bits of the bit string of second read data 30b are "10011101", and bits of the bit string of third read data 30c are "10111001". In the majority process, bits of the bit strings of the data 30a, 30b, and 30c at the corresponding bit positions are compared, and the majority process is performed on the values of the bits at the corresponding bit positions.

In the example of FIG. 8, different bit values are included among the data 30a to 30c at the bit positions of the bit bit-2 and the bit bit-5. Specifically, at the bit position of the bit bit-2, the bit values in the data 30a to 30c are a value "1", a value "0", and a value "1", respectively. At the bit position of the bit bit-5, the bit values in the data 30a to 30c are a value "0", a value "1", and a value "0", respectively.

At the bit position of the bit bit-2, the bit value "1" is read twice and the bit value "0" is read once out of three times of reading. Since the value "1" is read a larger number of times than (s−1)/2=1, the value "1" is used as the bit value at the bit position of the bit bit-2. Similarly, at the bit position of the bit bit-5, the bit value "0" is read twice and the bit value "1" is read once out of three times of reading. In this case, the value "0" is used as the bit value at the bit position of the bit bit-5.

The bit values at the bit positions other than the bit bit-2 and the bit bit-5 are the same among the data 30a to 30c, and the bit values at the bit positions of the bit bit-0, the bit bit-1, the bit bit-3, the bit bit-4, the bit bit-6, and the bit bit-7 are the value "1", the value "0", the value "1", the value "1", the value "0", and the value "1", respectively.

Thus, in this example, as a result of the majority process, the data 30d having the bit values "10111001" are adopted as read data. In the embodiment, an error correction process based on error correcting codes is performed on the read data adopted through the majority process.

Figure 9:
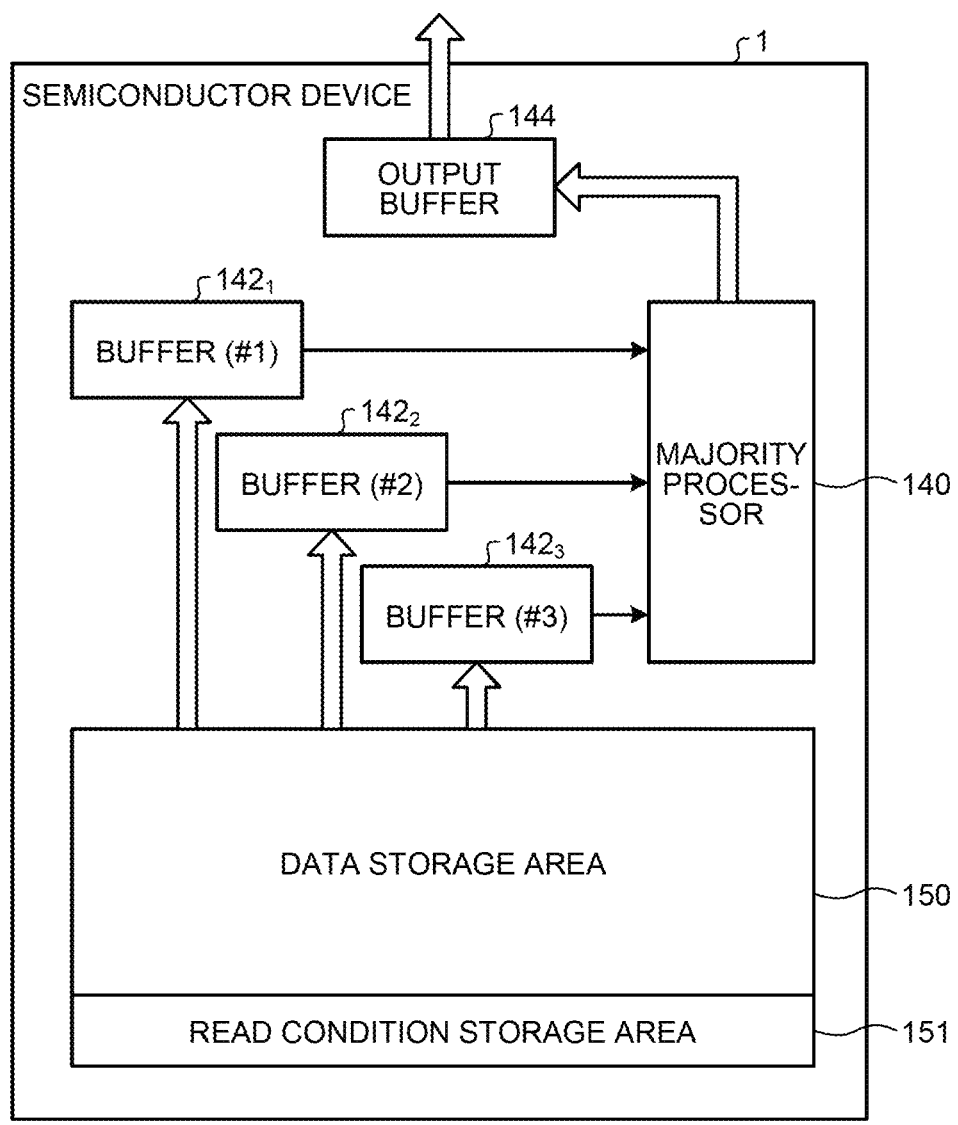
FIG. 9 is a schematic diagram schematically illustrating an example configuration for performing the majority process according to the embodiment.

FIG. 9 is a schematic diagram schematically illustrating an example configuration for performing the majority process according to the embodiment. In FIG. 9, the semiconductor device 1 includes a majority processor 140, buffers 142$_1$, 142$_2$, and 142$_3$, where the number of buffers corresponds to the number of times of reading (three in this example), an output buffer 144, a data storage area 150, and a read condition storage area 151. Note that, in FIG. 9, the buffers 142$_1$, 142$_2$, and 142$_3$ are also referred to as a buffer (#1), a buffer (#2), and a buffer (#3), respectively.

Among these components, the majority processor 140 is included in the controller 3 in FIG. 1, for example. The buffers 142$_1$, 142$_2$, and 142$_3$ and the output buffer 144 are included in an input/output unit 6, which will be described later with reference to FIG. 15, for example. The read condition storage area 151 is included in the controller 3. The data storage area 150 is included in the memory unit 2, for example.

The read condition storage area 151 stores in advance multiple retry read conditions including a default read condition that is a read condition in the initial state. In the semiconductor device 1, the controller 3 illustrated in FIG. 1 acquires a read condition from the read condition storage area 151 and sets conditions (such as thresholds) for reading data from the data storage area 150.

The data storage area 150 has user data stored therein. The user data contain a data body, and an error correcting code added to the data body, for example. The semiconductor device 1 reads data at a specified address in the data body from the data storage area 150. In this process, the semiconductor device 1 repeats reading data at the same address multiple times. In this example, the semiconductor device 1 repeats reading data at the same address three times.

Figure 10:
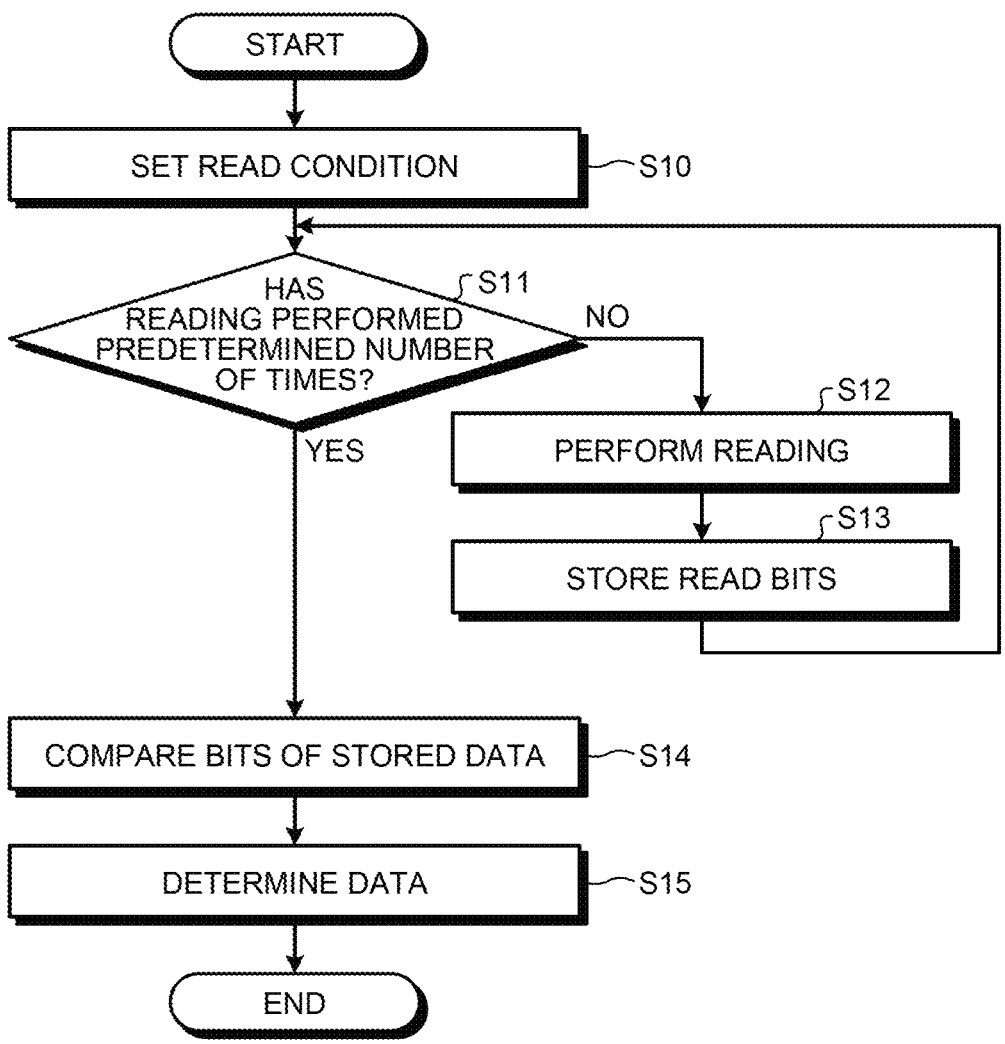
FIG. 10 is an example flowchart schematically illustrating a read process according to the embodiment.

FIG. 10 is an example flowchart schematically illustrating a read process according to the embodiment. In step S10, the semiconductor device 1 acquires a read condition from the read condition storage area 151, and sets the acquired read condition as a read condition for reading data from the data storage area 150. In the next step S11, the semiconductor device 1 determines whether or not reading from the same address in the data storage area 150 has been performed a predetermined number of times (herein, three). If it is determined that reading has not been performed the predetermined number of times, the semiconductor device 1 advances the process to step S12, and reads data from the data storage area 150.

In the next step S13, the semiconductor device 1 stores the data read in step S12 in one of the buffers 142$_1$, 142$_2$, and 142$_3$ associated with the number of times reading has been performed. Specifically, the semiconductor device 1 repeats the processing from step S11 to step S13 three times, and stores data read at the first time, the second time, and the third time into the buffers 142$_1$, 142$_2$, and 142$_3$, respectively.

If it is determined in step S11 that reading has been performed the predetermined number of times, the semiconductor device 1 advances the process to step S14. In step S14, the semiconductor device 1 reads data from the buffers 142$_1$, 142$_2$, and 142$_3$ and supplies the read data to the majority processor 140. The semiconductor device 1 then compares bits of the data at corresponding bit positions and performs the majority process at the respective bit positions by the majority processor 140.

In step S15, the semiconductor device 1 then determines data obtained as a result of the majority process to be data to be used, and stores the data in the output buffer 144.

Figure 11:
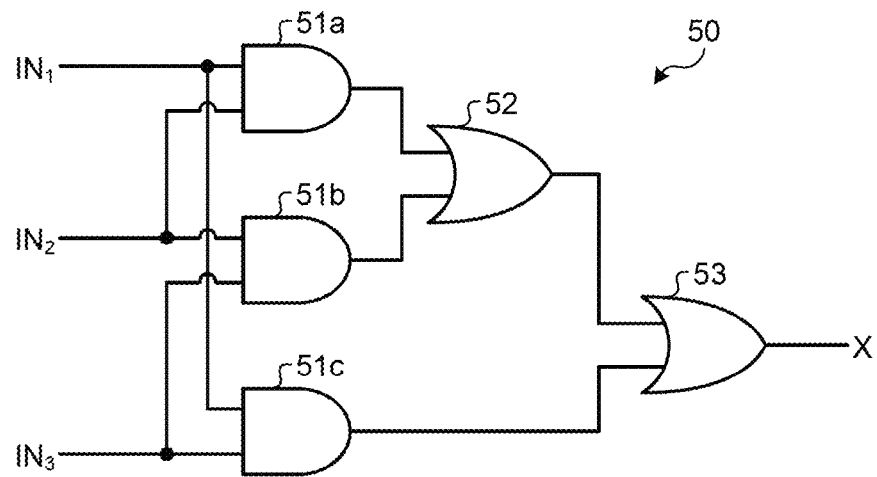
FIG. 11 is a circuit diagram illustrating an example of a majority circuit applicable to the embodiment.
Figure 12:
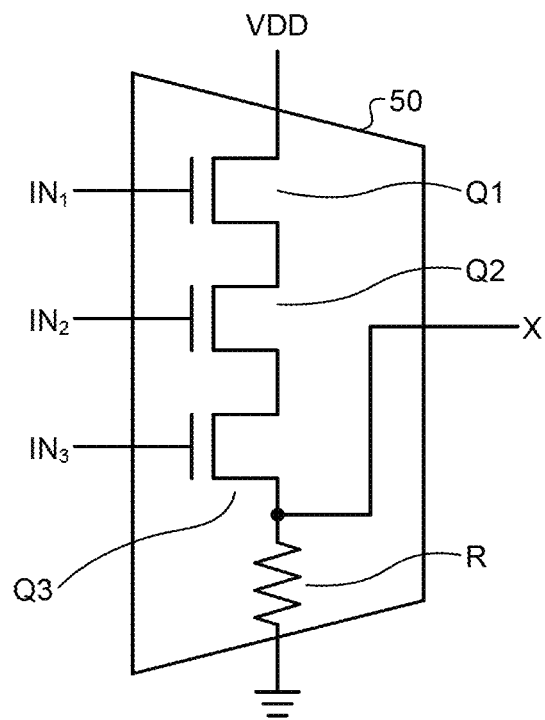
FIG. 12 is a circuit diagram illustrating an example of the majority circuit applicable to the embodiment.

FIGS. 11 and 12 illustrate examples of a majority circuit 50 included in the majority processor 140 applicable to the embodiment. Herein, examples of the majority circuit 50 in the case where the number of times reading of the same data is repeated is three. Furthermore, the majority circuits 50 illustrated in FIGS. 11 and 12 perform the majority process at one bit position.

FIG. 11 illustrates an example of the majority circuit 50 constituted by logic circuits. The majority circuit 50 illustrated in FIG. 11 is constituted by AND circuits 51a to 51c each having two inputs, and OR circuits 52 and 53. In FIG. 11, input signals $IN_1$, $IN_2$, and are bits read at the first reading, the second reading, and the third reading, respectively. The input signals $IN_1$, $IN_2$, and $IN_3$ are input to one of input terminals of the AND circuits 51a to 51c, respectively. The input signals $IN_1$, $IN_2$, and $IN_3$ are also input to the other of the input pots of the AND circuits 51c, 51a, and 51b, respectively.

The outputs of the AND circuits 51a and 51b are input to one and the other of input terminals of the OR circuit 52, respectively. Furthermore, the output of the AND circuit 51c and the output of the OR circuit 52 are input to one and the other of input terminals of the OR circuit 53, respectively. The output of the OR circuit 53 is the output of the majority circuit 50.

The majority circuit 50 of FIG. 11 processes the input signals $IN_2$, and $IN_3$ according to the following Equation (1):

$$X = \overline{IN_1} \cdot IN_2 \cdot IN_3 + \overline{IN_2} \cdot IN_1 \cdot IN_3 + \overline{IN_3} \cdot IN_2 \cdot IN_1 + IN_1 \cdot IN_2 \cdot IN_3 \quad (1)$$

According to Equation (1), one of the values "1" and "0" that is included more than the other in the input signals $IN_1$, $IN_2$, and $IN_3$ is output as an output signal X. For example, when the input signals $IN_1$ and $IN_2$ have the value "1" and the input signal $IN_3$ has the value "0", the number of the values "1" is two while the number of the values "0" is one, and the majority circuit 50 of FIG. 11 thus outputs the value "1" as the output signal X.

FIG. 12 illustrates an example of a majority circuit 50 configured to perform the majority process according to potential. In FIG. 12, the majority circuit 50 includes three transistors Q1, Q2, and Q3, and one resistor R. In the majority circuit of FIG. 12, the drain of the transistor Q2 is connected to the source of the transistor Q1, the source of the transistor Q2 is connected to the drain of the transistor Q3, and the transistors Q1 to Q3 are connected in series in a drain-source direction. The input signals $IN_1$, $IN_2$, and $IN_3$ are input to the gates of the transistors Q1, to Q3, respectively. A power source voltage VDD is supplied to the drain of the transistor Q1 at one end, and the resistor R having a resistance of $R_{Ref}$ and having one end grounded is connected to the source of the transistor Q3 at the other end. The output signal X is taken out from the connection point of the source of the transistor Q3 and the resistor.

In such a configuration, the input signals $IN_1$, $IN_2$, and $IN_3$ input to the gates of the transistors Q1 to Q3, respectively, are assumed to represent the bit value "1" in a high state (High) and represent the bit value "0" in a slow state (Low). Furthermore, the drain-to-source resistance $R_{DS}$ of each the transistors Q1 to Q3 is a low resistance when the gate voltage is in a high state (High) and a high resistance when the gate voltage is in a low state (Low).

Note that, for the sake of explanation, the transistors Q1 to Q3 are assumed to have equal characteristics and the drain-to-source resistances $R_{DS}$ are expressed as resistances $R_{DS}(IN_x)$ that are functions of the input signals $IN_x$ input to the gates. In this case, the total resistance $R_{total}$ between the input terminal (the drain terminal of the transistor Q1) for the power source voltage VDD to the grounded point is expressed by the following Equation (2):

$$R_{total} = R_{DS}(IN_1) + R_{DS}(IN_2) + R_{DS}(IN_3) + R_{ref} \quad (2)$$

When the voltage of the output signal X is measured between both ends of the resistor R, the voltage value of the output signal X is a voltage value obtained by dividing the voltage VDD according to the ratio of the resistance $R_{total}$ and the resistance $R_{ref}$ of Equation (2). Thus, comparison between a voltage value $V_1$ of the output signal X when any one of the input signals $IN_1$ to $IN_3$ is in the high state and the other two are in the low state and a voltage value $V_2$ of the output signal X when any one thereof is in the low state and the other two are in the high state results in $V_2 > V_1$. On this basis, the majority process can be performed through determination on the output signal X using a voltage value $V_{th}$ between the voltage value $V_2$ and the voltage value $V_1$ as a threshold.

Figure 13:
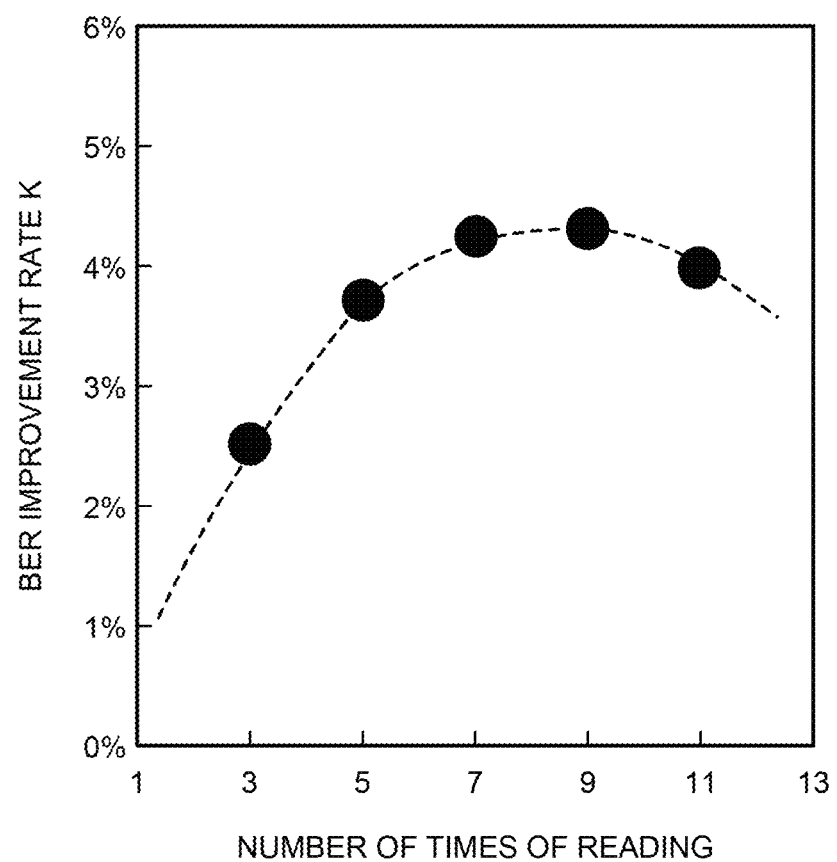
FIG. 13 is a graph for explaining effects of the majority process according to the embodiment.

Effects of the majority process according to the embodiment will be described with reference to FIGS. 13, 14A, and 14B. FIG. 13 illustrates an example of measured values of a bit error ratio (BER) improvement rate K resulting from improvement of the BER by the majority process. In FIG. 13, the vertical axis represents the BER improvement rate K and the horizontal axis represents the number of times of reading in the majority process.

Note that the bit error ratio BER is defined as BER=Y/Z when a block of Z bits is written and then read and Y bits of data out of the read data are errors. When it is assumed that Y' bits of data are errors after the majority process, the bit error ratio BER' after the majority process is BER'=Y'/Z. The bit error improvement rate K is defined as K=(Y−Y')/Z.

The example of FIG. 13 indicates that, in majority process, a BER improvement rate K of about 2.5% is achieved even when the number of times of reading is three and that the maximum BER improvement value K of about 4.2% is achieved when the number of times of reading is seven to nine. In contrast, when the number of times of reading is eleven, the BER improvement rate K is lower than that when the number of times of reading is nine. Thus, in the example of FIG. 13, it can be deemed that an optimum value of the number of times of reading in the majority process is present.

Figure 14A:
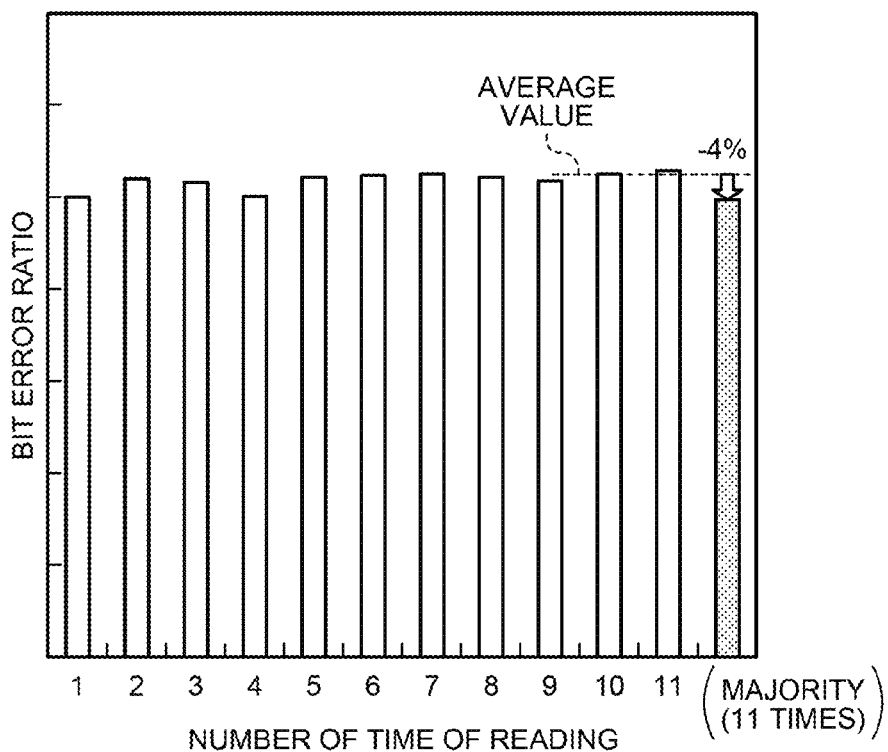
FIGS. 14A and 14B are graphs for explaining effects of the majority process according to the embodiment.
Figure 14B:
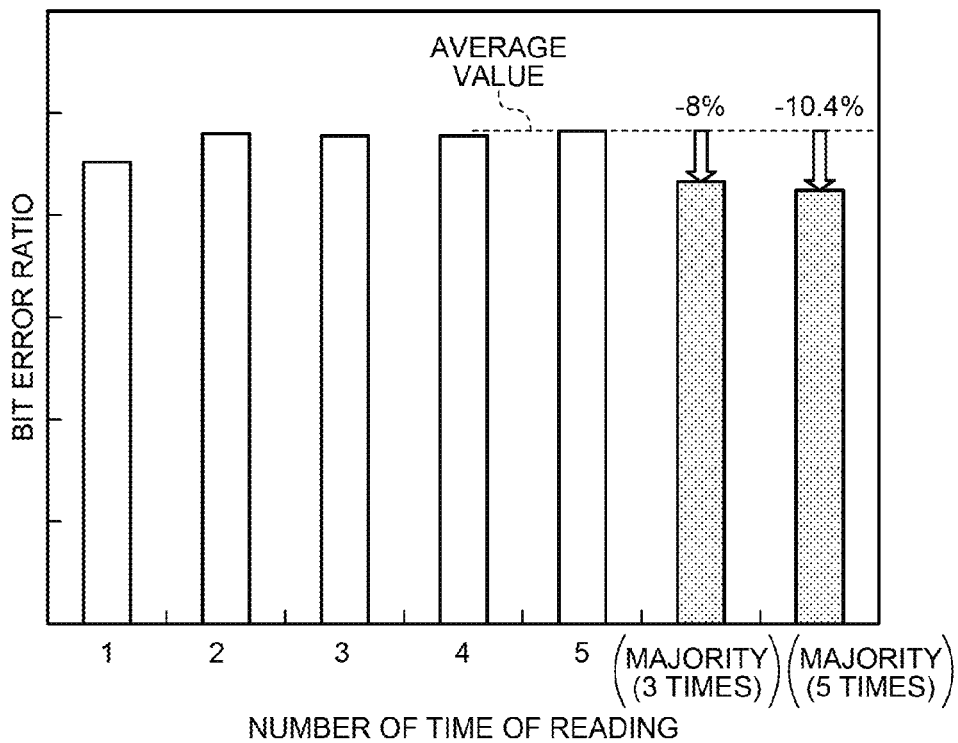

FIGS. 14A and 14B illustrate examples of measurement of the relation between the bit error ratio BER and the majority process in a case where 2-bit information is stored in the memory cells and in a case where 3-bit information is stored in the memory cells. In FIGS. 14A and 14B, the vertical axis represents the bit error ratio BER and the horizontal axis represents each time of reading of the repeated reading and the majority process.

FIG. 14A illustrates an example of the bit error ratio BER when 2-bit information is stored in the memory cells. The example of FIG. 14A is an example in which reading is repeated eleven times before the majority process, and the bar at the right end represents an example of the bit error ratio BER as a result of the majority process. The other bars represent examples of the bit error ratio BER at respective times of reading when the majority process is not performed.

As is apparent from FIG. 14A, when the majority process is performed on the basis of reading repeated eleven times, the bit error ratio BER is reduced by about 4% from relative to the average value when the majority process is not performed.

FIG. 14B illustrates an example of the bit error ratio BER when 3-bit information is stored in the memory cells. The example of FIG. 14B is an example in which reading is repeated five times and the majority process is performed at the third time and the fifth time. In FIG. 14B, the bar at the right end represents an example of the bit error ratio BER when the majority process is performed on the basis of five times of reading and the bar next to the right end bar represents an example of the bit error ratio BER when the majority process is performed on the basis of three times of reading. The other bars represent examples of the bit error ratio BER at respective times of reading when the majority process is not performed.

As is apparent from FIG. 14B, the bit error ratio BER is reduced by about 8% when the majority process is performed on the basis of reading repeated three times, and the bit error ratio BER is reduced by about 10.4% when the majority process is performed on the basis of reading repeated five times, relative to the average value when the majority process is not performed.

As described above, as a result of using the majority process, it is possible to reduce the bit error ratio BER even when the number of times reading is repeated is small.

More Detailed Configuration of Semiconductor Device According to Embodiment

Figure 15:
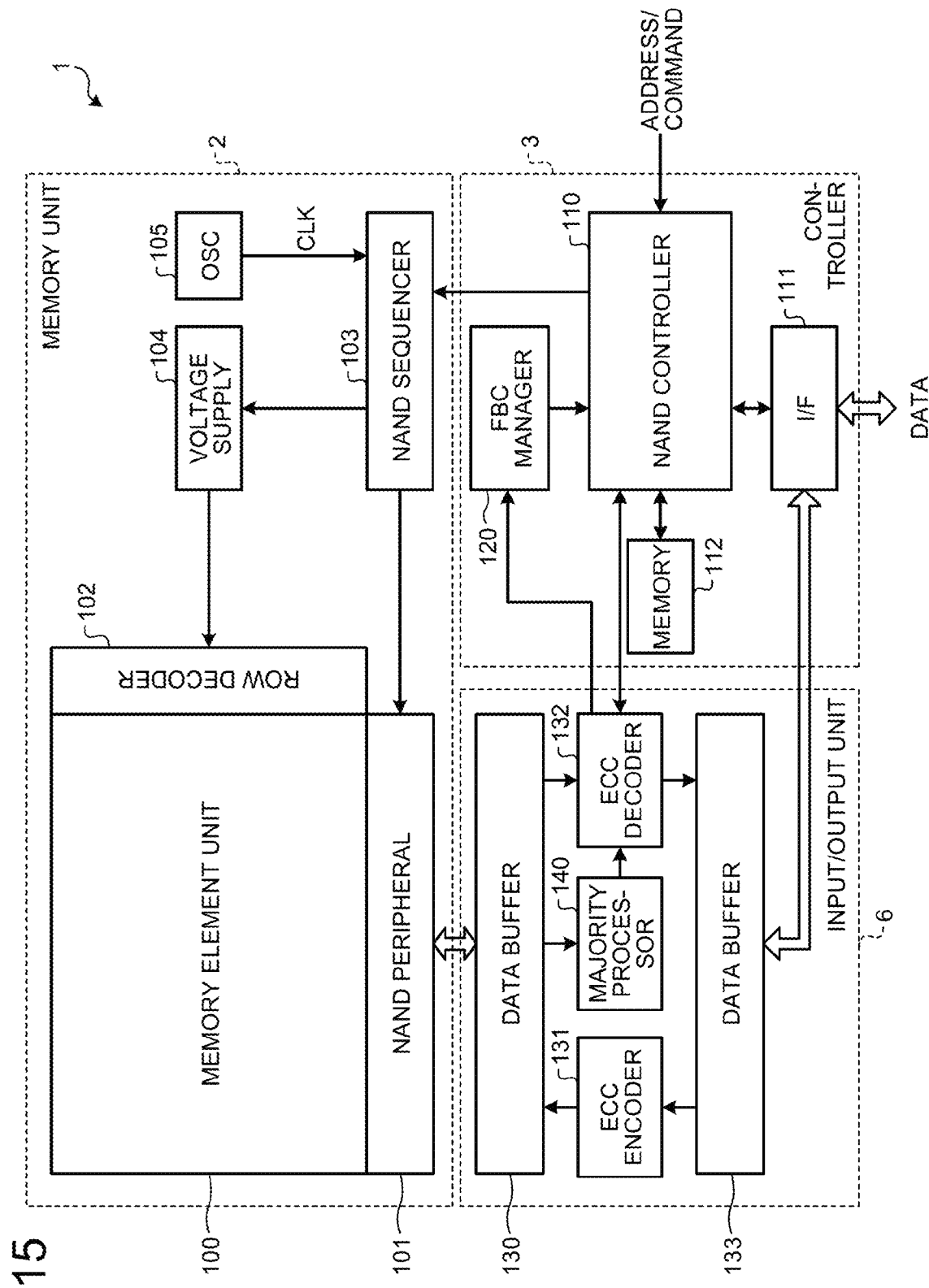
FIG. 15 is a block diagram illustrating an example of the configuration of the semiconductor device according to the embodiment in more detail.

Next, the semiconductor device 1 according to the embodiment will be described in more detail. FIG. 15 illustrates an example of the configuration of the semiconductor device 1 according to the embodiment in more detail. In FIG. 15, components that are the same as those in FIG. 1 described above will be designated by the same reference numerals and detailed description thereof will not be repeated.

The semiconductor device 1 includes the memory unit 2, the controller 3, and the input/output unit 6. The input/output unit 6 includes the function of the input unit 4 and the function of the output unit 5 in FIG. 1. The memory unit 2 includes a memory element unit 100, a NAND peripheral 101, a row decoder 102, a NAND sequencer 103, a voltage supply 104, and an oscillator (OSC) 105.

The memory element unit 100 is provided with memory cells arranged in a matrix as illustrated in FIG. 2, and includes multiple memory blocks BLK. The memory element unit 100 can select one word line from the word lines WL1 to WLn and detect the voltages of the bit lines BL1 to BLm in a memory block BLK to read information from the memory cells at which the selected word line of the bit lines BL1 to BLm intersect with each other.

The NAND peripheral 101 includes sense amplifiers for reading voltages of the bit lines BL1 to BLm of each of the memory blocks BLK included in the memory element unit 100. The NAND peripheral 101 also includes a column decoder for writing data into the memory cells and reading data from the memory cells according to the control of the NAND sequencer 103.

The voltage supply 104 supplies a voltage for selecting a specified word line from the word lines WL1 to WLn of each memory block BLK to the row decoder 102 according to the control of the NAND sequencer 103. The OSC 105 generates a clock signal CLK and supplies the generated clock signal CLK to the NAND sequencer 103.

The NAND sequencer 103 operates according to the clock signal CLK generated by the OSC 105. The NAND sequencer 103 outputs a selection signal for selecting a word line to the row decoder 102 and outputs a selection signal for selecting a bit line to the NAND peripheral 101 according to a control signal supplied from a NAND controller 110, which will be described later, for example. The NAND sequencer 103 also outputs a signal for setting thresholds Th in reading information from the memory cells to the NAND peripheral 101 according to a control signal supplied from the NAND controller 110.

The input/output unit 6 includes a data buffer 130, an ECC encoder 131, an ECC decoder 132, a data buffer 133, and the majority processor 140. The input/output unit 6 processes data to be written into the memory element unit 100 and data read from the memory element unit 100. The data buffer 130 temporarily stores data read from the memory element unit 100 and data to be written into the memory element unit 100.

The data buffer 133 temporarily stores data input to the semiconductor device 1 via an interface (I/F) 111, which will be described later, so as to be written into the memory element unit 100. The data buffer 133 also temporarily stores data read from the memory element unit 100 so as to be output via the I/F 111.

The error correcting code (ECC) encoder 131 performs an error correction encoding on supplied data. For example, the ECC encoder 131 generates an error correcting code on the basis of original data input via the I/F 111 and stored in the data buffer 133. The ECC encoder 131 adds the generated error correcting code to the original data and outputs the resulting data. The data output from the ECC encoder 131 are supplied to the NAND peripheral 101 via the data buffer 130 and written into the memory element unit 100.

The ECC decoder 132 performs a decoding process associated with the error correction encoding by the ECC encoder 131. More specifically, the ECC decoder 132 decodes the error correcting code of data read from the memory element unit 100 and supplied via the data buffer 130, performs the error correction process, and outputs the resulting data as decoded data. The decoded data output from the ECC decoder 132 is output to outside of the semiconductor device 1 via the data buffer 133 and the I/F 111.

When errors in excess of the error correcting capability of the error correcting code contained in the data to be decoded are present in the data, the ECC decoder 132 outputs information indicating the number of error bits without performing the error correction process, for example. The information indicating the number of error bits output from the ECC decoder 132 is supplied to a FBC manager 120. When errors in excess of the error correcting capability of the error correcting code contained in the data to be decoded are present in the data and the error correction process has not been performed, the ECC decoder 132 informs the NAND controller 110 of the same.

The majority processor 140 performs the majority process described above. Specifically, the majority processor 140 compares bits at corresponding bit positions of data read from the same address in the memory element unit 100 multiple times, and performs the majority process. The majority processor 140 supplies data obtained by the majority process to the ECC decoder 132. The ECC decoder 132 decodes the data supplied from the majority processor 140, performs the error correction process, and outputs the error-corrected data.

The controller 3 includes the NAND controller 110, the I/F 111, a memory 112, and the fail bit count (FBC) manager 120. The I/F 111 passes information indicating the input/output state of data to the NAND controller 110. The memory 112 is a rewritable nonvolatile memory that stores in advance multiple read conditions for reading data from the memory element unit 100. For example, the memory 112 stores in advance a shift table storing multiple set of thresholds Th for reading from the memory cells.

The NAND controller 110 receives various commands including commands instructing reading from and writing to the memory element unit 100 from the outside. A command instructing reading or writing contains address information indicating an address for specification to the memory element unit 100, for example. The NAND controller 110 supplies a control signal containing the address information to the NAND sequencer 103 on the basis of the address information and a read command supplied from the outside.

When the NAND controller 110 has received a notification informing that the error correction process could not be performed from the ECC decoder 132, the NAND controller 110 supplies a control signal for performing retry read to the NAND sequencer 103. The NAND controller 110 reads and acquires a read condition different from the currently used read condition from the memory 112 for each retry read, and supplies the acquired read condition to the NAND sequencer 103. The NAND sequencer 103 supplies the read condition to the NAND peripheral 101.

When errors in excess of the error correcting capability of an error correcting code are present in data read in retry read, the ECC decoder 132 supplies information indicating the number of error bits to the FBC manager 120. The FBC manager 120 manages the information indicating the number of error bits of each retry read. The NAND controller 110 determines a read condition to be used as default on the basis of the number of error bits of each retry read managed by the FBC manager 120. The NAND controller 110 also determines whether or not to perform the majority process by the majority processor 140 depending on the result of decoding by the ECC decoder 132.

Figure 16:
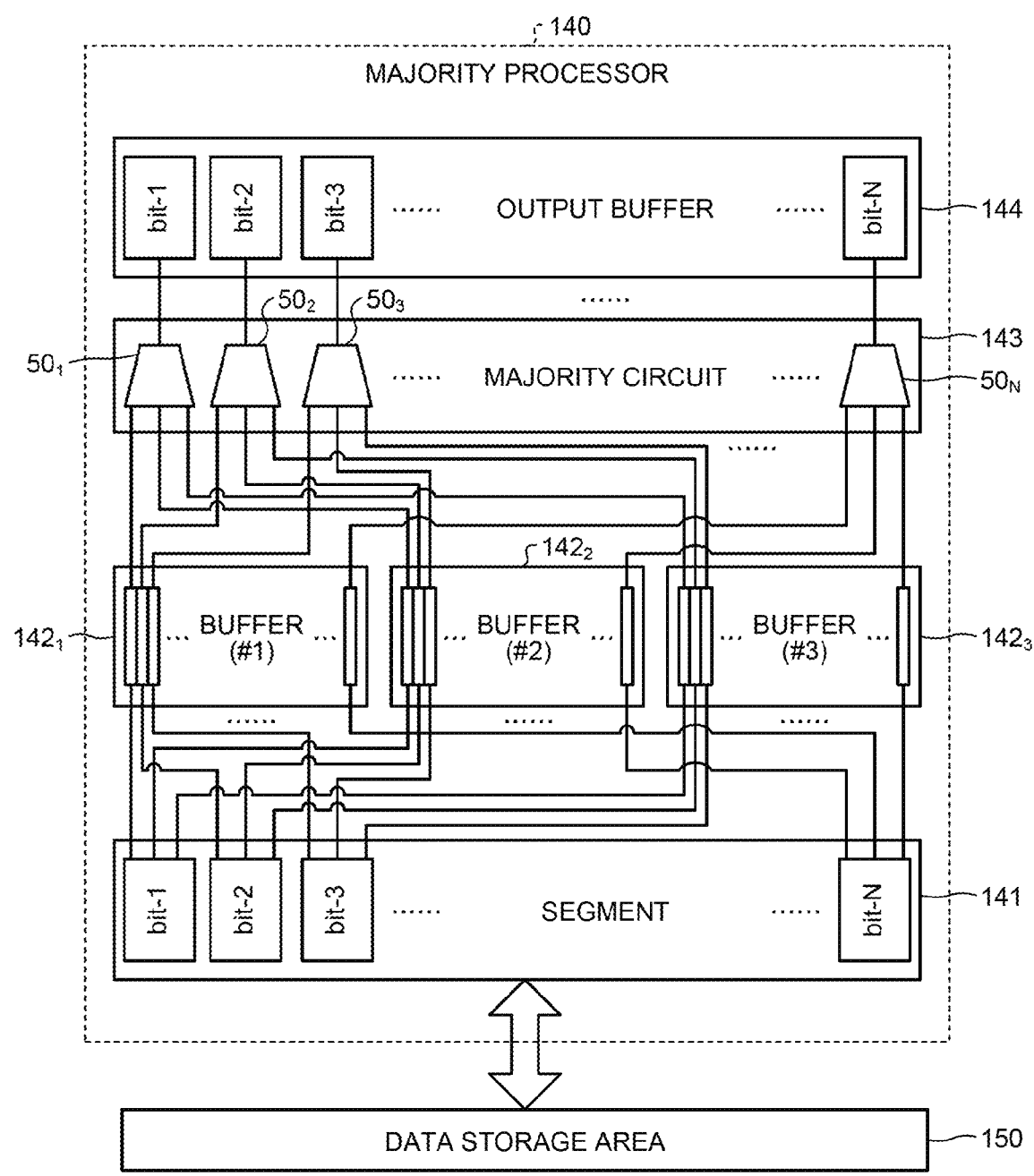
FIG. 16 is a block diagram illustrating an example configuration of a majority processor.

FIG. 16 illustrates an example configuration of the majority processor 140 according to the embodiment. In FIG. 16, the data storage area 150 corresponds to the memory element unit 100. The majority processor 140 includes a segment 141, the buffers $142_1$, $142_2$, and $142_3$, where the number of buffers corresponds to the number of times of reading (three in this example) performed in the majority process, a majority circuit 143, and an output buffer 144.

The segment 141 is a register, for example, that stores data read from the data storage area 150 in units of bits, and includes multiple bit storage areas for storing data in units of bits. In this example, it is assumed that N-bit data are read from the data storage area 150, and the segment 141 includes N bit storage areas associated with N bit data bit-1, bit-2, bit-3, . . . , bit-N.

The buffers $142_1$, $142_2$, and $142_3$ each include N bit storage areas associated with N bit data bit-1, bit-2, bit-3, . . . , bit-N similarly to the segment 141. The bit storage areas of the segment 141 are connected to the bit storage areas of the respective buffers $142_1$, $142_2$, and $142_3$ at corresponding bit positions.

For example, in the majority process, N-bit bit data read from the data storage area 150 at the first reading are supplied to the buffer $142_1$ via the bit storage areas of the segment 141 and stored in the bit storage areas in the buffer $142_1$ at bit positions corresponding to those of the bit storage areas of the segment 141. Similarly, N-bit bit data read from the data storage area 150 at the second reading are stored in the bit storage areas in the buffer $142_2$ at bit positions corresponding to those of the bit storage areas of the segment 141 via the bit storage areas of the segment 141. Similarly, at the third reading from the data storage area 150, N-bit bit data read from the data storage area 150 are stored in the bit storage areas in the buffer $142_3$ at bit positions corresponding to those of the bit storage areas of the segment 141.

The majority circuit 143 includes N majority circuits $50_1$, $50_2$, $50_3$, . . . , $50_N$ associated with the number bits read from the data storage area 150. The majority circuits $50_1$, $50_2$, $50_3$, . . . , $50_N$ may have either of the configuration for performing the majority process using the logic circuits illustrated in FIG. 11 and the configuration for performing the majority process according to the potential illustrated in FIG. 12. Alternatively, majority processing circuits having other configurations capable of producing similar processing results may be used.

The majority circuits $50_1$, $50_2$, $50_3$, . . . , $50_N$ perform the majority process on three input signals $IN_1$, $IN_2$, and $IN_3$ according to the number of times of reading in the majority process as illustrated in FIGS. 11 and 12. The N bit data bit-1, bit-2, bit-3, . . . , bit-N stored in the bit storage areas in each of the buffers $142_1$, $142_2$, and $142_3$ are supplied to the majority circuits $50_1$, $50_2$, $50_3$, . . . , $50_N$, respectively, as input signals $IN_1$, $IN_2$, and $IN_3$.

For example, the bit data bit-1 in the buffer $142_1$, $142_2$, $142_3$ are input to the majority circuit $50_1$ as input signals $IN_1$, $IN_2$, and $IN_3$, respectively. Similarly, the bit data bit-2 in the buffer $142_1$, $142_2$, and $142_3$ are input to the majority circuit as input signals $IN_1$, $IN_2$, and $IN_3$, respectively.

The output buffer 144 includes N bit storage areas associated with N bit data bit-1, bit-2, bit-3, . . . , bit-N similarly to the buffers $142_1$, $142_2$, and $142_3$ and the segment 141. The outputs of the majority circuits $50_1$, $50_2$, $50_3$, . . . , $50_N$ are connected to the bit storage areas in the output buffer 144 at corresponding bit positions. N bit data bit-1, bit-2, bit-3, . . . , bit-N stored in the bit storage areas of the output buffer 144 are output as data resulting from the majority process from the majority processor 140.

Although it is explained in FIG. 15 described above that the majority processor 140 is included in the input/output unit 6, the majority processor 140 is not limited to this example. The majority processor 140 can alternatively be included in the controller 3. The configuration in which the majority processor 140 is present in the controller 3 is preferable in that the majority processor 140 can be constituted by logic circuits in the controller 3.

Figure 17:
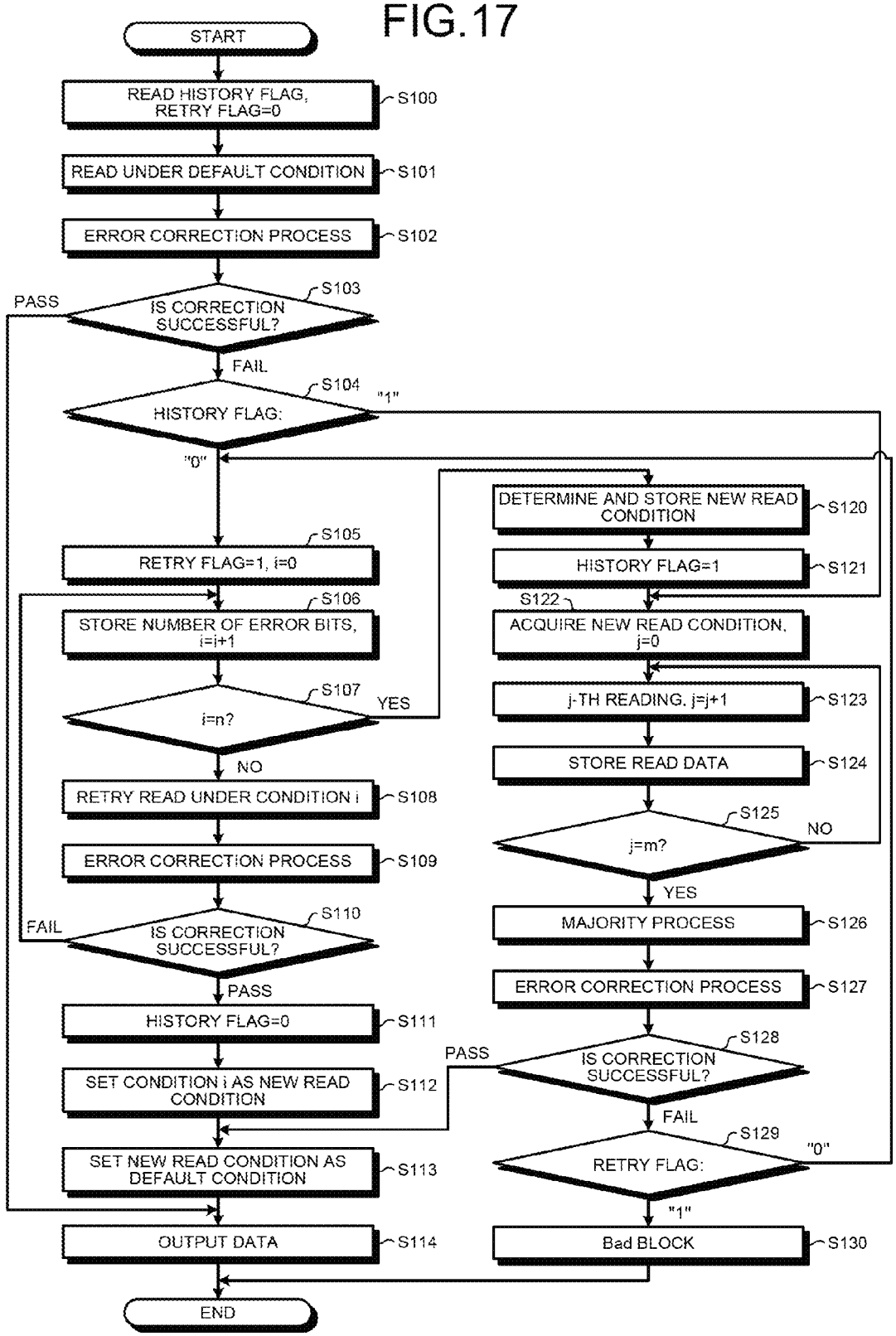
FIG. 17 is an example flowchart illustrating a read process according to the embodiment.

FIG. 17 is an example flowchart illustrating a process of reading data from the memory unit 2 (memory element unit 100) in the semiconductor device 1 according to the embodiment. The process according to the flowchart of FIG. 17 is performed for each unit (memory block BLK, for example) of reading from the memory element unit 100. Note that the NAND controller 110 sets a default read condition in advance for the NAND sequencer 103 before the process according to the flowchart.

The process according to the flowchart of FIG. 17 is starts when the NAND controller 110 has received a read access command from the outside. The read access command received by the NAND controller 110 contains address information indicating an address for reading data from the memory element unit 100.

In step S100, the NAND controller 110 reads a history flag from the memory 112 and sets the value of a retry flag to "0". Note that the history flag has an initial value of value "0", and is not initialized by the read access command. Alternatively, the history flag may be initialized by each of read access commands for different memory blocks BLK or may be initialized by each of read access commands for different memory chips when multiple memory chips are included in the memory element unit 100.

In the next step S101, the NAND controller 110 instructs the NAND sequencer 103 to read data from the memory element unit 100 according to the address indicated in the read access command under the default read condition. The NAND sequencer 103 controls the NAND peripheral 101 to read data from the specified address in the memory element unit 100 according to the command.

The data read from the memory element unit 100 are supplied to the ECC decoder 132 via the data buffer 130. The ECC decoder 132 decodes an error correcting code of the data supplied from the data buffer 130, and performs an error correction process (step S102). The ECC decoder 132 informs the NAND controller 110 of the error correction result.

In the next step S103, the NAND controller 110 determines whether or not the error correction is successful on the basis of the error correction result from the ECC decoder 132. If it is determined that the error correction of the read data is successful (Pass), the NAND controller 110 advances the process to step S114. In step S114, the NAND controller 110 outputs data resulting from the error correction process by the ECC decoder 132 to the outside of the semiconductor device 1 via the data buffer 133 and the I/F 111.

If the NAND controller 110 has received information indicating that a number of errors in excess of the error correcting capability of the error correcting code are contained in the read data from the ECC decoder 132 in the error correction process of step S102, the NAND controller 110 determines in step S103 that error correction cannot be performed (Fail). In this case, the NAND controller 110 advances the process to step S104, and checks the value of the history flag. If the value of the history flag is "1", the NAND controller 110 advances the process to step S122.

If the value of the history flag is "0", the NAND controller 110 advances the process to step S105, and sets the value of the retry flag to "1" and the value of a variable i to "0".

In the next step S106, the FBC manager 120 stores information indicating the number of error bits present in the data, which is output from the ECC decoder 132, as the number of error bits in the i-th read process. The NAND controller 110 also increments the value of the variable i by 1 so that the variable i=i+1 is obtained.

In the next step S107, the NAND controller 110 determines whether or not the value of the variable i has reached a predetermined value n. If it is determined that the variable i has not reached the value n, the NAND controller 110 advances the process to step S108.

In step S108, the NAND controller 110 reads the i-th read condition i from the memory 112. The NAND controller 110 then instructs the NAND sequencer 103 to perform retry read from the memory element unit 100 according to the read read condition i. The NAND sequencer 103 performs retry read of reading data from the same address as the address from which reading is performed in step S101 according to the instruction.

The data read from the memory element unit 100 through the retry read are supplied to the ECC decoder 132 via the data buffer 130. The ECC decoder 132 decodes the error correcting code of the data supplied from the data buffer 130 and performs the error correction process (step S109). The ECC decoder 132 informs the NAND controller 110 of the error correction result.

In the next step S110, the NAND controller 110 determines whether or not the error correction is successful on the basis of the error correction result from the ECC decoder 132. If the NAND controller 110 has received information indicating that a number of errors in excess of the error correcting capability of the error correcting code are contained in the read data from the ECC decoder 132 in the error correction process of step S109, the NAND controller 110 determines in step S110 that error correction is not successful (Fail). In this case, the process is returned to step S106, where the number of error bits is stored as the number of error bits of the i-th read process by the FBC manager 120. Thereafter, the value of the variable i is incremented by 1.

If it is determined in step S110 that the error correction of the read data is successful (Pass), the NAND controller 110 advances the process to step S111, and initializes the history flag to the value "0".

In the next step S112, the NAND controller 110 sets the read condition i as a new read condition. The process is advance to step S113, where the NAND controller 110 updates the default read condition with the new read condition. The NAND controller 110 then advances the process to step S114, and outputs data resulting from the error correction process by the ECC decoder 132 to the outside of the semiconductor device 1 via the data buffer 133 and the I/F 111.

If it is determined in step S107 described above that the variable i has reached the value n, the NAND controller 110 advances the process to step S120. In step S120, the NAND controller 110 acquires the numbers of error bits associated with n read conditions acquired in the loop of steps S106 to S110 from the FBC manager 120. The NAND controller 110 then selects the smallest number of error bits from the acquired n numbers of error bits, and determines a read condition associated with the selected number of error bits to be a new read condition. The NAND controller 110 stores information indicating the new read condition in the memory 112.

In the next step S121, the NAND controller 110 sets the value of the history flag to "1". In the next step S122, the NAND controller 110 then acquires the new read condition from the memory 112. The NAND controller 110 also sets the value of a variable j to "0".

In the next step S123, the NAND controller 110 increments the variable j by 1 so that the variable j=j+1 is obtained, and instructs the NAND sequencer 103 to read data from the memory element unit 100 according to the acquired new read condition. The NAND sequencer 103 performs the j-th reading of reading data from the same address as the address from which reading is performed in step S101 according to the instruction.

The data read from the memory element unit 100 through the j-th reading are supplied to the majority processor 140 via the data buffer 130. In step S124, the majority processor 140 stores the supplied data in a buffer the buffer 142$_1$, for example, when j=1).

In the next step S125, the NAND controller 110 determines whether or not the value of the variable j has reached a predetermined value m. The value m is a value indicating the number of data to be compared in the majority process, and it is assumed that m=3 herein. If it is determined that the variable j has not reached the value m, the NAND controller 110 returns the process to step S123, increments the variable j by 1, and performs the j-th reading. The majority processor 140 stores the read data in the next buffer (the buffer 142$_2$, for example, when j=2).

If it is determined in step S125 that the variable j has reached the value m, the process is advanced to step S126. In step S126, the majority processor 140 compares bits of the data stored in the respective buffers in step S124 at the corresponding bit positions, and performs the majority process on the values of the bits at the corresponding bit positions. The majority processor 140 passes data obtained has a result of the majority process to the ECC decoder 132.

In the next step S127, the ECC decoder 132 performs the error correction process on the data supplied from the majority processor 140. In this process, the ECC decoder 132 can perform error correction by using any one of error correcting codes obtained in m times of reading. Alternatively, the error correction process may be performed by using the error correcting code obtained in reading in step S101. Furthermore, in the processing of steps S123 to S126, the error correction process may be performed by performing the majority process on the error correcting codes and using the resulting code.

The ECC decoder 132 informs the NAND controller 110 of the error correction result. In the next step S128, the NAND controller 110 determines whether or not the error correction on the data obtained as a result of the majority process in step S126 on the basis of the error correction result from the ECC decoder 132. If it is determined that the error correction process is successful (Pass), the NAND controller 110 advances the process to step S113 described above, and sets the new read condition determined in step S120 to be the default read condition.

If it is determined in step S128 that the error correction is not successful (Fail), the NAND controller 110 advances the process to step S129, and checks the value of the retry flag. If the retry flag is determined to be the value "0", the NAND controller 110 returns the process to step S105.

If the retry flag is determined to be the value "1" in step S129, the NAND controller 110 advances the process to step S130. In step S130, the NAND controller 110 determines that the block from which data is read is a defective (Bad) block, stores that the block is a Bad block in the memory 112, and terminates the series of processes in the flowchart of FIG. 17.

As described above, in the embodiment, reading of data from the memory cells is performed in combination with the retry read and the majority process. It is thus possible to reduce the number of times of retry read as compared to the case where only retry read is performed. Furthermore, as a result of using the majority process, accidental errors, which have been difficult to be relieved by retry read through shift read, can also be coped with and the device lifetime can be extended. Furthermore, it is also possible to initially perform retry read when errors cannot be relieved owing to environmental impact or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
an error corrector configured to
perform error correction on data read from a storage, and
output the number of errors contained in the data when errors cannot be corrected by the error correction;
a read controller configured to
read pieces of data from a first address in the storage according to respective read conditions,
select, from the read conditions, a read condition corresponding to a smallest of the numbers of errors obtained by the error correction performed on the pieces of data corresponding to the respective read conditions, and
perform reading from the first address multiple times according to the selected read condition; and
a majority processor configured to perform a majority process between a plurality of pieces of data obtained by the multiple times of reading.

2. The semiconductor device according to claim 1, wherein when an error of a piece of data read from the first address under a first read condition of the read conditions cannot be corrected by the error correction and an error of a piece of data read from the first address under a second read condition of the read conditions can be corrected by the error correction, the read controller updates the first read condition with the second read condition and performs the multiple times of reading according to the updated first read condition.

3. The semiconductor device according to claim 1, wherein when errors of all of the pieces of data read from the first address according to the respective read conditions cannot be corrected by the error correction, the read controller updates the first read condition with a read condition corresponding to a smallest of the numbers of errors obtained by the error correction, and performs the multiple times of reading according to the updated first read condition.

4. The semiconductor device according to claim 1, wherein
the majority processor performs the majority process between bits at a corresponding bit position in bit strings of the respective pieces of data, and
the error corrector further performs error correction on a piece of data obtained by the majority process.

5. A reading method comprising:
performing error correction on data read from a storage, and output the number of errors contained in the data when errors cannot be corrected by the error correction;
reading pieces of data from a first address in the storage according to respective read conditions;
selecting, from the read conditions, a read condition corresponding to a smallest of the numbers of errors obtained by the error correction performed on the pieces of data corresponding to the respective read conditions;
performing reading from the first address multiple times according to the selected read condition; and
performing a majority process between a plurality of pieces of data obtained by the multiple times of reading.

* * * * *